United States Patent [19]
Matsuzaki et al.

[11] Patent Number: 5,631,524
[45] Date of Patent: May 20, 1997

[54] SWITCHING APPARATUS

[75] Inventors: Kazuo Matsuzaki; Arika Amano, both of Nagano, Japan

[73] Assignee: Fuji Electric Co. Ltd., Japan

[21] Appl. No.: 279,163

[22] Filed: Jul. 22, 1994

[30] Foreign Application Priority Data

Jul. 28, 1993 [JP] Japan ................... 5-185414

[51] Int. Cl.⁶ ................................... H01J 11/04
[52] U.S. Cl. ................. 315/344; 313/325; 361/133
[58] Field of Search ................ 315/344, 111.21, 315/111.41, 111.51; 361/120, 133; 313/231.11, 231.31, 325

[56] References Cited

U.S. PATENT DOCUMENTS

| | | | |
|---|---|---|---|
| 3,093,767 | 6/1963 | Lafferty | 315/344 |
| 3,811,070 | 5/1974 | Voshall | 315/150 |
| 5,091,819 | 2/1992 | Christiansen et al. | 361/120 |
| 5,217,401 | 6/1993 | Watanabe et al. | 445/24 |
| 5,336,975 | 8/1994 | Goebel et al. | 315/111.41 |

FOREIGN PATENT DOCUMENTS

| | | |
|---|---|---|
| 2705488A1 | 8/1978 | Germany . |
| 3721529A1 | 1/1989 | Germany . |
| 3-261040 | 11/1991 | Japan . |

*Primary Examiner*—Robert Pascal
*Assistant Examiner*—Michael B. Shingleton
*Attorney, Agent, or Firm*—Rossi & Associates

[57] ABSTRACT

A switching apparatus obtains a large switching current by multiplying the number of electrons emitted by field emission from a cold cathode. The switching apparatus is driven by an optical wave and includes a recess portion of an insulation layer formed on a silicon substrate, a cold cathode formed on the insulation layer comprising many comb-tooth like tips extending from one side above the recess portion, a gate electrode disposed on the recess portion on the side of the cold cathode, an anode formed on the insulation layer and extending from another side opposed facing to the one side above the recess portion, an optically transparent sealing member comprising a recess portion on its under surface for enclosing a dilute nitrogen gas in a vacuum space, and a semiconductor laser, supported on the sealing member by a support member, for irradiating a laser beam through the sealing member into the space.

4 Claims, 6 Drawing Sheets

SWITCHING APPARATUS

FIELD OF THE INVENTION

The present invention relates to a switching apparatus that employs electron emission from a cold cathode (field effect electron emission), and more specifically, the present invention relates to a switching apparatus in which the switching operation is controlled by an optical or electromagnetic wave.

BACKGROUND

A conventional vacuum tube employs a hot cathode as an electron emitting source that requires pre-heating and therefore consumes a great deal of energy. The hot cathode is not suitable for miniaturization and integration by the employment of the semiconductor technology. Electron-emitting devices which utilize a cold cathode have attracted much attention as alternatives of the vacuum tube. Such devices include a field effect electron emitter element that emits electrons by a locally applied high electric field.

FIG. 7 is a sectional view that schematically shows a configuration of a field effect electron emitter element and FIGS. 8(A), 8(B), 8(C) and 8(D) are sectional views for explaining the processes used to manufacture the element of FIG. 7. As shown in FIG. 7, the prior art electron emitter element comprises a conical cold cathode 2 made of Mo formed on a silicon substrate 1, an opening 4 formed between the cold cathode 2, an insulation layer (silicon oxide layer) 3 formed on the substrate 1, and a control electrode 5 formed over the insulation layer 3 and extending partially above the opening 4. The cold cathode 2 and the control electrode 5, which constitute an electron emitter, are enclosed in an evacuated space by a sealing member not shown in the figure. Positive electric potential applied to the control electrode 5 concentrates a high intensity electric field on a sharp top of the cold cathode 2. The high intensity electric field modifies the work function of the cold cathode 2 and narrows a gap of the integrated potential across the boundary surface of the cold cathode 2, and electrons are emitted by field emission through a quantum mechanical tunnel process based on the Schottky effect.

The field effect electron emitter element provided with the conical cold cathode 2 is manufactured as follows. As shown in FIG. 8(A), the silicon oxide insulation layer 3 is formed on the semiconductor substrate 1 made for example of Si. The control electrode 5 is formed by patterning a Mo layer deposited on the insulation layer 3. The opening 4 is then formed by selective etching. As shown in FIG. 8(B), the substrate 1 is rotated around the X axis and an Al layer 6 is formed on the control electrode 5 by vapor deposition so that an end face of the Al layer 6 may tilt by a predetermined angle θ. Then, as FIG. 8(C) illustrates, Mo is deposited vertically onto the substrate 1 by the electron beam vapor deposition technique. Since Mo is deposited on a side surface of the Al layer 6 as well as on the Al layer 6 and the substrate 1 through the electron beam deposition process, a diameter of an opening on the Al layer 6 and deposition area of a Mo layer on the substrate 1 decrease as the deposition of the Mo layer 7 proceeds. Thus, the conical cathode 2 is formed on the substrate 1. Finally, as shown in FIG. 8(D), the field effect electron emitter element provided with the conical cold cathode 2 and the control electrode 5 facing to the sharp top of the cathode 2 is obtained by removing the Mo layer 7 and the Al layer 6.

The field effect electron emitter element described above is attractive in that the element does not need to have a pre-heating means and has a structure which is well suited for down-sizing. However, the production accuracy and reproducibility of area and height, and therefore the production yield, of the conical cathode 2 are not acceptable enough to practically use the device of the prior art because the conical cathode 2 is formed by gradually closing the opening by vapor deposition.

The prior art electron emitter element is not suitable to be employed in a large current capacity switching device because a current obtained at a top of the electron emitter (emitter current density) is small.

In view of the foregoing, an object of the present invention is to provide a switching apparatus that multiplies electrons emitted by field emission from a cold cathode and is suitable for switching a large current.

SUMMARY OF THE INVENTION

The object of the present invention is achieved by a switching apparatus that comprises a means for emitting electrons from a cold cathode by field emission, and a means for multiplying dissociated electrons (electron avalanche or electron cascade shower) by an interaction among the emitted electrons, an optical or electromagnetic wave, and atoms or molecules of a diluted gas.

More specifically, the switching apparatus driven by an optical wave of the present invention comprises an electron emitting means including a cold cathode for emitting electrons by an applied electric field, an electron capturing means including an anode for capturing electrons attracted from the cathode through vacuum space, an optically transparent sealing means for enclosing dilute gas in the vacuum space, and an irradiation means for intermittently irradiating an optical wave to the vacuum space.

The object of the present invention is also achieved by a switching apparatus driven by an electromagnetic wave that comprises an electron emitting means including a cold cathode for emitting electrons by an applied electric field, an electron capturing means further comprising an anode for capturing electrons attracted thereto from the cathode through vacuum space, an insulative sealing means for enclosing dilute gas in the vacuum space, a magnetic field application means for applying in the vacuum space a magnetic field orthogonal to an electric field applied between the cathode and the anode, and an electromagnetic irradiation means for intermittently irradiating an electromagnetic wave to the vacuum space.

The aforementioned switching apparatuses according to the present invention employ the following configurations that facilitate the manufacturing of the apparatuses by semiconductor processing techniques.

The switching apparatus driven by an optical wave preferably comprises an insulation layer, formed on a semiconductor substrate, including a recess portion, a cathode formed on one side of the recess portion on the insulation layer, an anode formed on another side opposed facing to the one side of the recess portion on the insulation layer, a control electrode formed on the side of the cathode on the recess portion, an optically transparent sealing means for enclosing dilute gas in vacuum space enveloping the cathode, the anode, and the control electrode, and an optical irradiation means for intermittently irradiating an optical wave to the vacuum space.

The switching apparatus driven by an electromagnetic wave preferable comprises an insulation layer, formed on a semiconductor substrate, including a recess portion, a cathode formed on one side of the recess portion on the insulation layer, an anode formed on another side opposed facing to the one side of the recess portion on the insulation layer, a control electrode formed on the side of the cathode on the recess portion, an insulative sealing means for enclosing dilute gas in vacuum space enveloping the cathode, the anode, and the control electrode, a magnetic field application means for applying in the vacuum space a magnetic field orthogonal to an electric field applied between the cathode and the anode, and an electromagnetic irradiation means for intermittently irradiating an electromagnetic wave to the vacuum space.

The cathode of the switching apparatuses described above preferably comprises a plurality of comb-tooth like tips, which are preferably manufactured by semiconductor manufacturing processes.

BRIEF DESCRIPTION OF THE DRAWINGS

The invention will be described in detail hereinafter with reference to the accompanied drawings which illustrate preferred embodiments of the present invention, wherein:

FIG. 1 is a diagram showing the configuration of a first embodiment of the switching apparatus driven by an optical wave according to the present invention, in which

FIG. 3 is a diagram showing the configuration of the semiconductor chip of a second embodiment of the switching apparatus driven by an electromagnetic wave according to the present invention, in which

FIG. 4 is a diagram showing the configuration of the second embodiment of the switching apparatus driven by an electromagnetic wave according to the present invention, in which

DETAILED DESCRIPTION OF THE PREFERRED EMBODIMENTS

Figure 1A:
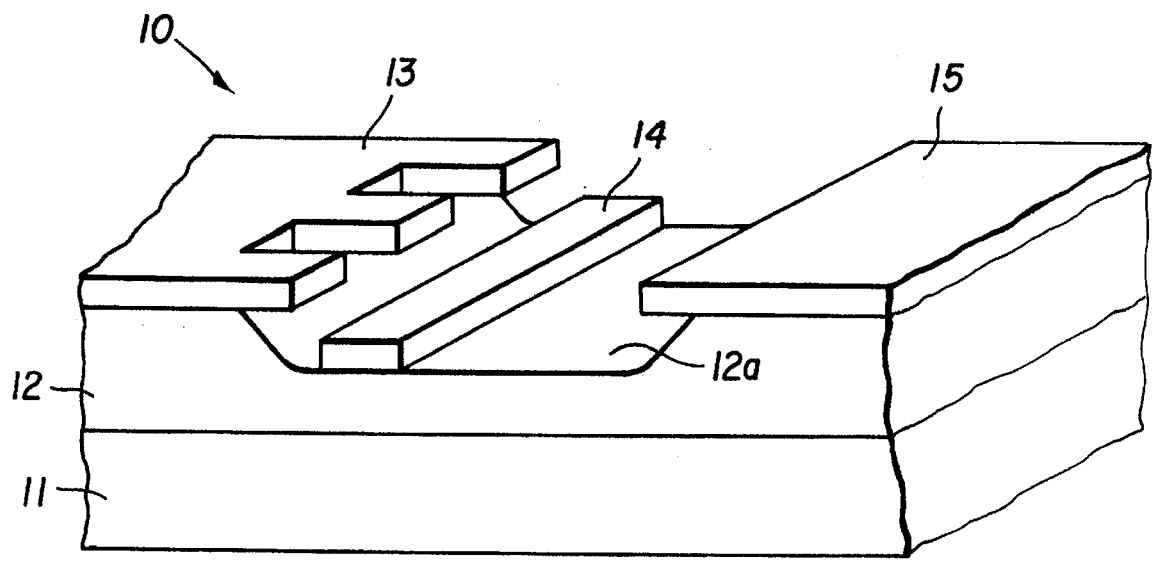
FIG. 1(a) shows a perspective view and FIG. 1(b) a sectional view.

The switching apparatuses according to the present invention obtain a large current by enhancing an electron avalanche by means of an interaction among electrons emitted by field emission from a cold cathode, an optical or electromagnetic wave and atoms or molecules of a diluted gas.

In a first embodiment, the switching apparatus obtains excited atoms of a diluted gas by collision with accelerated electrons and ionizes the excited atoms by collision with photons. In a second embodiment, the switching apparatus obtains accelerated electrons by cyclotron resonance and ionizes the atoms of a diluted gas by collision with the accelerated electrons.

As described above, the first embodiment of the switching apparatus preferably comprises an optically transparent sealing means for enclosing dilute gas in the vacuum space, and an optical irradiation means for intermittently irradiating an optical wave to the vacuum space. Electrons emitted from the cold cathode by field emission are accelerated to the anode and collides with atoms (molecules) of the dilute gas filled in the vacuum space. Though a drifting electron does not usually carry energy high enough to dissociate (ionize) an orbit electron of the gas atom since the energy of the drifting electron is not so high in so far as the anode is not biased to considerably high potential, the atom M of the dilute gas is shifted to its excited state (M*) as a result of energy transfer by the collision with a to some extent accelerated electron e*.

$$e^* + M \rightarrow e + m^* \tag{1}$$

Assuming a perfect elastic collision, kinetic energy of the accelerated electron is totally transferred to the atom M. When a photon is irradiated by the optical irradiation means to the excited atom M*, the excited atom M* acquires photon energy h ν. When the photon energy hν exceeds the dissociation energy, the atom is ionized by dissociation to form an ion-electron pair (an ion and a dissociated electron).

$$M^* + h\nu \rightarrow M + e, \tag{2}$$

where, h is the Plank's constant and ν is a wave number of an optical wave. Therefore by summarizing the equations 1 and 2, the following equation is obtained:

$$e^* + M + h\nu \rightarrow 2e + M^+. \tag{3}$$

Thus, multiplication of the number of electrons or carrier increase occurs though the multiplicity or increment depends an electric field for accelerating electrons determined by anode potential, collision cross section (collision probability) of the accelerated electron with the atom, and the collision cross section of the excited atom with the photon. The dissociated electron triggers further ionization following Equation 3 and enhances electron avalanche. The multiplied electrons flow into the anode and the ions return to the gas atoms by recombination with electrons at the cathode.

Thus the anode current shows an amplified value higher than the anode current value based only on the emitted electrons. A switching function of a large current is therefore realized by switching an optical irradiation means on and off. A leak current is suppressed by stopping electron emission (for example by lowering the control electric potential) in synchronous with switching off of the ray irradiation. High speed switching is realized by only switching on and off the ray emitted by the irradiation means while maintaining the electron emission at the same level irrespective of on and off of the optical ray irradiation.

The first embodiment, which increases current density by the collision of electrons with atoms and optical dissociation, expands design freedom of the structure and shape of the cold cathode. Thus, the first embodiment facilitates manufacturing the switching apparatus with excellent reproducibility and high yield. Since a sufficiently large current is obtained by the first embodiment of the switching apparatus, the first embodiment facilitates suppressing anode potential at lower level than the switching apparatus according to the prior art.

The switching apparatus of the first embodiment, which is driven by an optical wave, can be easily manufactured by conventional semiconductor processing techniques and is well suited for down-sizing as well as mass-production. In particular, the switching apparatus comprises an electron emitting means that includes a cold cathode for emitting electrons by an applied electric field, an electron capturing means that includes an anode for capturing electrons attracted from the cathode through vacuum space, an optically transparent sealing means for enclosing dilute gas in the vacuum space, and an optical irradiation means for intermittently irradiating an optical wave to the vacuum space. Since the comb-tooth like tips of the cold cathode are easily formed by photolithography, the anode current is easily increased, and unfavorable statistical distributions in the structural parameters and performance of the switching apparatus are minimized.

The second embodiment of the switching apparatus according to the present invention, which is driven by an electromagnetic wave, comprises, in addition to the basic structural elements of the conventional miniature vacuum tube, an insulative sealing means for enclosing dilute gas in the vacuum space, a magnetic field application means for applying in the vacuum space a magnetic field orthogonal to an electric field applied between the cathode and the anode, and an electromagnetic irradiation means for intermittently irradiating an electromagnetic wave to the vacuum space. In the second embodiment, the traveling length of an electron as a charged particle emitted by field emission is increased by cyclotron rotation enhanced by the orthogonal magnetic field on the way of its attraction to the anode. The rotating electron is accelerated by repeatedly feeding kinetic energy by the cyclotron resonance enhanced when an angular cyclotron frequency $\omega_c$ of the electron, that is determined by magnetic flux density orthogonal to the rotation trajectory of the electron, and an angular frequency $\omega_f$ of an irradiated electromagnetic wave coincide with each other. The accelerated electron collides with dilute gas molecules to ionize the gas molecules. The electrons multiplied by the ionization are captured by the anode and the ionized particles are captured by the cathode. A much larger current is obtained from the anode when the cyclotron resonance is enhanced than an anode current based only on the electrons when the cyclotron resonance is not enhanced. Electrons are drawn out from the cathode 1 by the Schottky effect (tunnel effect) similarly as in the first embodiment. A current density j of the electrons emitted by field emission from the cathode 1 is given by following Fowler-Nordheim equation:

$$j = BE_0^2 \exp(-C/E_0), \qquad (1)$$

where, E0 represents an external electric field on the boundary surface of the cathode, and B and C are constants. Though the equation 1 is derived under the assumption that electrons which belong to the lower levels than the Fermi level are emitted at 0° K., it is experimentally well known that the equation shows such temperature independence that the equation may be used at higher temperatures than the room temperature.

Figure 5:
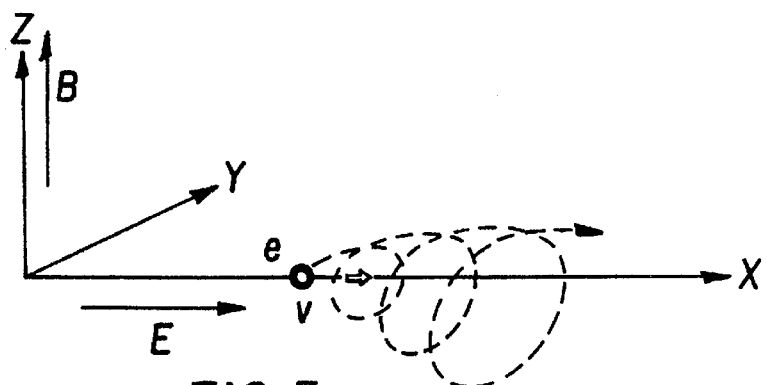
FIG. 5 is a schematic for explaining cyclotron resonance in the second embodiment.

As shown in FIG. 5, the field-emitted electron is attracted to the anode by an electric field E of the anode at a drift velocity along the X-direction. The moving electron rotates (executes circular movement) at an angular frequency $\omega_c$ represented by a following equation on an XY plane in the orthogonal coordinates defined by an X axis set along the electric field E and a Z axis set along the uniform orthogonal magnetic field applied by the magnetic field application means:

$$\omega_c = eB/m = 175.65B \ [GHz], \qquad (5)$$

where, e represents electric charge of an electron, m mass of an electron, and B a flux density of the orthogonal magnetic field. The cyclotron angular frequency $\omega_c$ does not depends on velocity of an electron and is proportional to the magnetic flux density B. Therefore the angular frequency $\omega_c$ increases and rotation trajectory (traveling length) of the electron elongates with increasing magnetic flux density B. Thus the electron rotates while moving towards the anode.

In this situation, cyclotron resonance is enhanced under a specific condition during an electromagnetic wave is irradiated to an electron path. Since the electron is accelerated when the angular vibration frequency $\omega$ of the electromagnetic wave coincides with the cyclotron angular frequency $\omega_c$ and an electric field direction of the irradiated electromagnetic wave coincides with the X-axis, rotation velocity of the electron becomes faster and radius of rotation R given by a following equation gradually increases.

$$R = mv/(eB) = V/\omega_c \qquad (3)$$

Thus, the electron travels towards the anode along a spiral trajectory. The dilute gas is sealed in by an insulative sealing means in the vacuum space. Since the electron accelerated by the cyclotron resonance acquires kinetic energy higher than dissociation energy of the molecule (atom) M of the dilute gas and large collision cross section (collision probability) due to the elongated traveling length as a result of its spiral movement, the accelerated electron collides with and dissociates to ionize the gas molecule M to generate one or two released electron or electrons. Since the released electron or electrons are then accelerated to trigger further ionization of the gas molecules or atoms, multiplied electrons and ions exponentially increase in the vacuum space. The electrons are captured by the anode and ions by the cathode. Though only field-emitted electrons are captured by the anode to generate small anode current when the cyclotron resonance is not enhanced (in off-period), a large anode current based on the multiplied carriers is observed when the cyclotron resonance is enhanced (in on-period).

The second embodiment, which increases the number of carriers by ionization by means of cyclotron resonance and collision of the resonating electrons with atoms, facilitates increasing switching current density, and manufacturing the switching apparatus with excellent reproducibility and high yield. The second embodiment of the switching apparatus facilitates suppressing anode potential at lower level than the switching apparatus according to the prior art.

The switching apparatus, which is driven by an electromagnetic wave, is easily manufactured using conventional semiconductor processing techniques and is well suited for down-sizing as well as mass-production. This switching apparatus comprises an insulation layer, formed on a semiconductor substrate, that includes a recess portion, a cathode formed on one side of the recess portion on the insulation layer, an anode formed on another side opposed facing to the one side of the recess portion on the insulation layer, a control electrode formed on the side of the cathode on the recess portion, an insulative sealing means for enclosing dilute gas in vacuum space enveloping the cathode, the anode, and the control electrode, a magnetic field application means for applying in the vacuum space a magnetic field orthogonal to an electric field applied between the cathode and the anode, and an electromagnetic irradiation means for intermittently irradiating an electromagnetic wave to the vacuum space. The comb-tooth like tips of the cold cathode, which are easily formed by the photolithography, increase the current based on the electron emission and contribute to reducing unfavorable statistical distribution of the structural parameters and the performance of the switching apparatus.

Figure 1B:
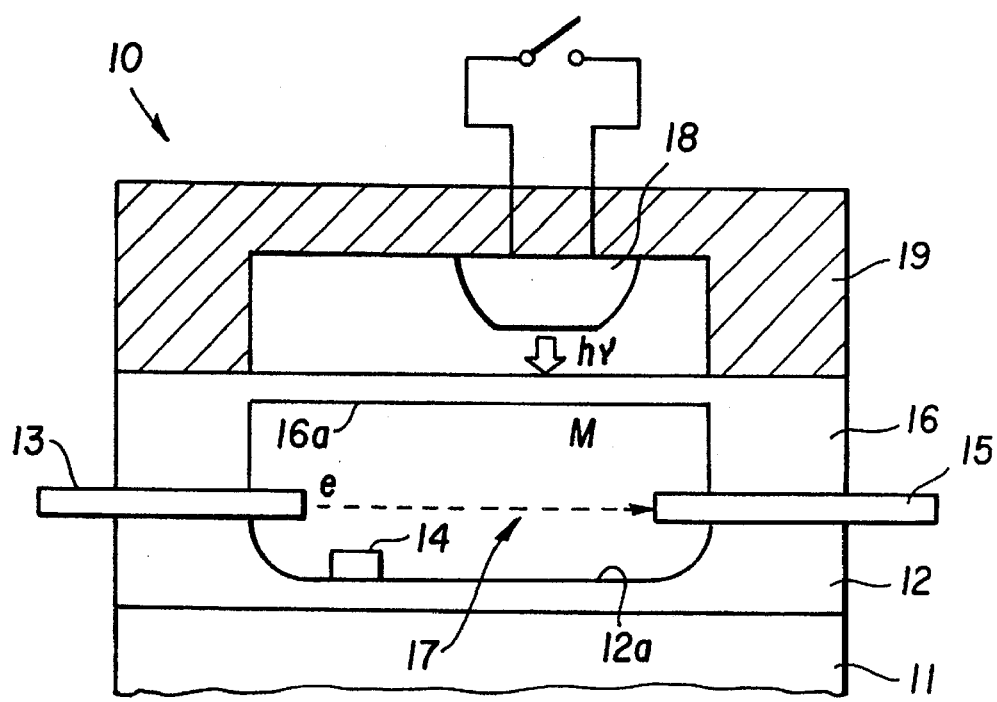

FIG. 1 shows a configuration of the first embodiment of a switching apparatus driven by an optical wave according to the present invention, in which FIG. 1(a) shows a perspective view and FIG. 1(b) a sectional view of a semiconductor chip of the switching apparatus. The switching apparatus 10 comprises an oxidized silicon layer (hereinafter referred to as insulation layer) 12 formed on a silicon substrate 11, an inverted trapezoidal recess portion 12a formed on the insulation layer 12, a wolfram cold cathode (emitter electrode) 13 formed on the insulation layer 12 further comprising many comb-tooth like tips extending from one side above the recess portion 12a, a rectangular molybdenum gate electrode (control electrode) 14 disposed on the recess portion 12a on the side of the cold cathode 13, a wolfram anode (collector electrode) 15 formed on the insulation layer 12 and extending from another side opposed facing to the one side above the recess portion 12a, an optically transparent sealing member (quartz) 16 further comprising a recess portion 16a on its under surface for enclosing a dilute nitrogen gas in a vacuum space 17, and a semiconductor laser 18, supported on the outside of the sealing member 16 by a support member 19, for irradiating a laser beam through the sealing member 16 into the space 17.

Typical configurational parameters of the first embodiment are as follows. Size (chip size) of the silicon substrate 11 is 2 mm×2 mm. Thickness of the cathode 13 is 0.2 μm. Edge width of the comb-tooth like tip is 3 μm and pitch between the tips is 6 μm. The cathode 13 comprises about 270 pieces of tips and total width of the cathode 13 is about 1.6 mm. The gate electrode 14 is 0.2 μm in thickness and 3 μm in width.

The anode 15 is 0.2 μm in thickness and about 1.6 mm in width. Distance between the cathode 13 and the gate electrode 14 is 0.7 μm. Distance between the cathode 13 and the anode 15 is 5 μm. The vacuum space 17 is filled with $3 \times 10^{-19}$ mole of the dilute nitrogen gas and the pressure is $6.67 \times 10^{-6}$ Pa. Wave length of the laser beam from the semiconductor laser 18 is 632.8 nm.

Figure 2:
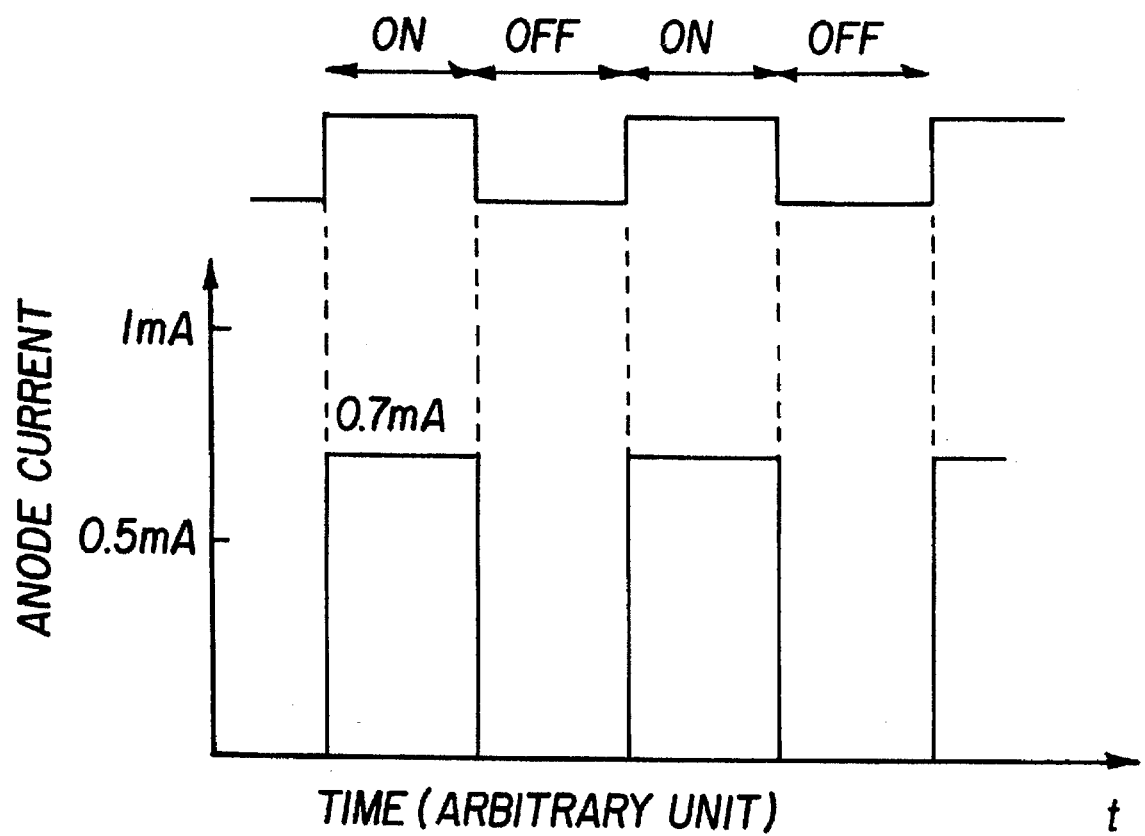
FIG. 2 is a chart for explaining on-off timing between an anode current and laser beam irradiation.

In the first embodiment, the potential of the gate electrode 14 and the anode 15 is fixed at 150 V. By this biasing, electrons e are emitted by field emission from the cathode 13 and accelerated toward the anode 15. The accelerated electron collides with the nitrogen gas atom (molecule) M and transfer its energy to the atom M to shift the nitrogen gas atom M to an excited state ($C^3 \Pi_u$). Thus, the space 17 is filled with the excited atoms M*. When an optical wave (photon) is irradiated from the semiconductor laser 18 to the excited atoms M*, the excited atoms M* acquire the photon energy hω. When the photon energy exceeds the dissociation energy, an ion-electron pair (an ion and a dissociated electron) is formed by the dissociation of the atom to increase number of electrons or carriers. The multiplied ions flow into the anode and ions return to the gas molecules M through re-combination with electrons in the cathode. In correspondence with this, an amplified anode current is obtained which is much larger than an anode current based only on the emitted electrons. As shown in FIG. 2, the anode current value is near zero when the laser beam is not irradiated (off-period of laser irradiation). In contrast to this, an anode current of 0.7 mA is obtained when the laser beam is irradiated (on-period of laser irradiation). Thus, a switching function of a large current is realized by switching the laser beam irradiation on and off.

As described above, the first embodiment multiplies carriers by the collision of electrons with atoms and optical dissociation, facilitates increasing current density of the switching apparatus and expands design freedom of the structure and shape of the cold cathode 13. The first embodiment also facilitates manufacturing the switching apparatus with excellent reproducibility and high yield. Since a sufficiently large current is obtained by the first embodiment of the switching apparatus, the anode potential can be maintained at a lower level than the prior art switching apparatus. Since the comb-tooth like tips of the cathode are easily formed by the conventional photolithographic technique, the anode current is amplified easily, and unfavorable statistical distributions in the manufacturing and performance of the switching apparatus are minimized.

Figure 3A:
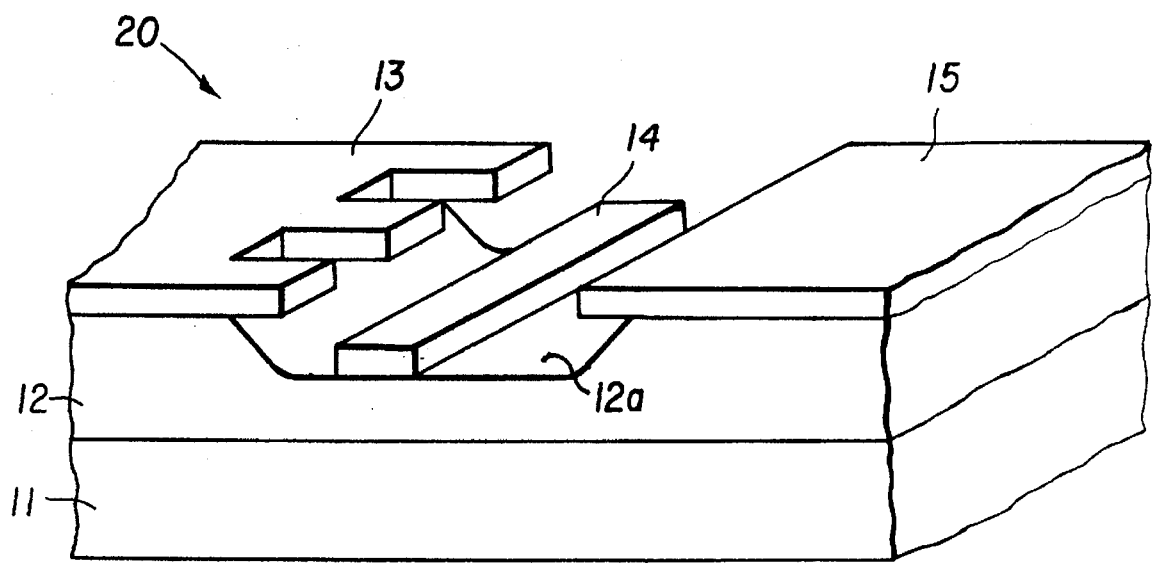
FIG. 3(a) shows a perspective view and FIG. 3(b) a sectional view.
Figure 3B:
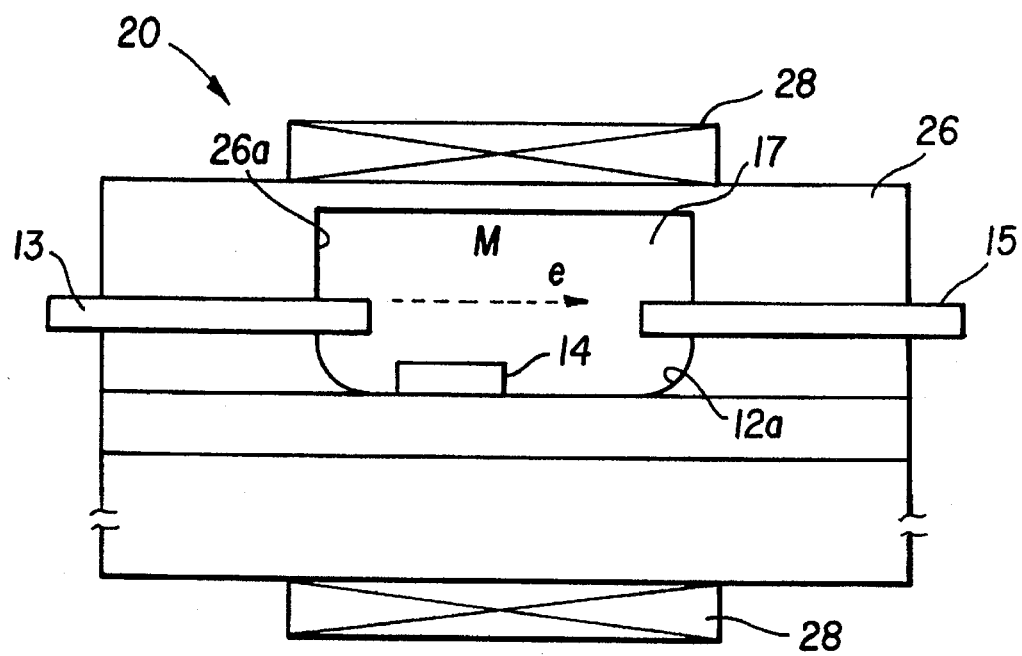
Figure 4A:
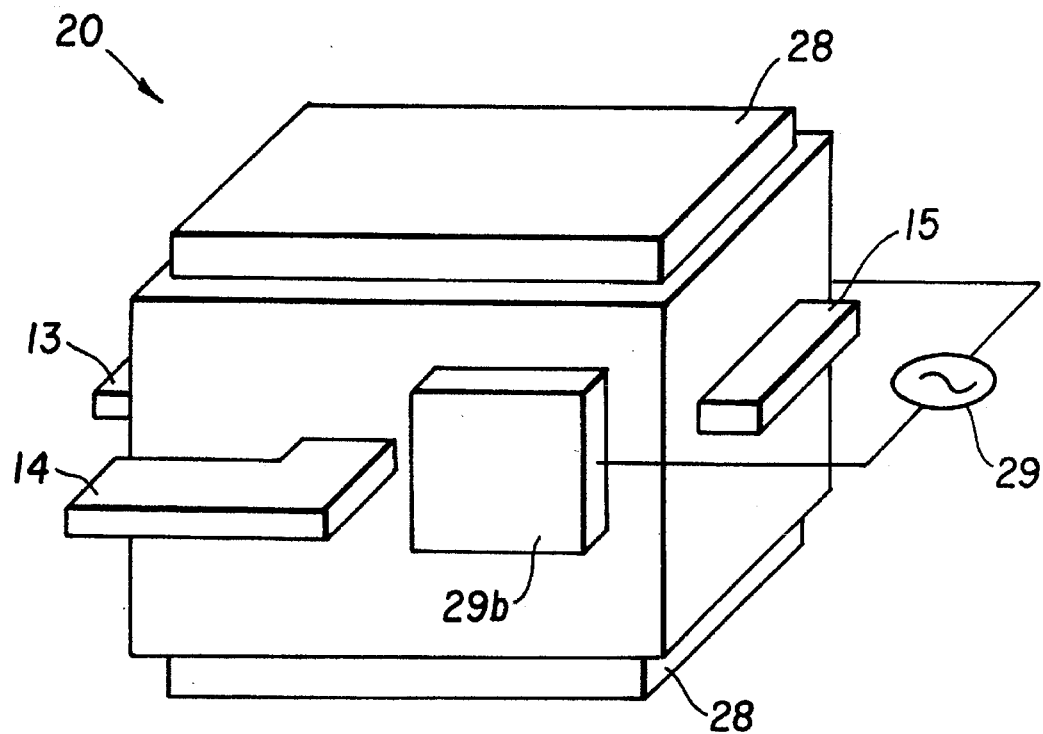
FIG. 4(a) shows a perspective view and FIG. 4(b) a plan view.
Figure 4B:
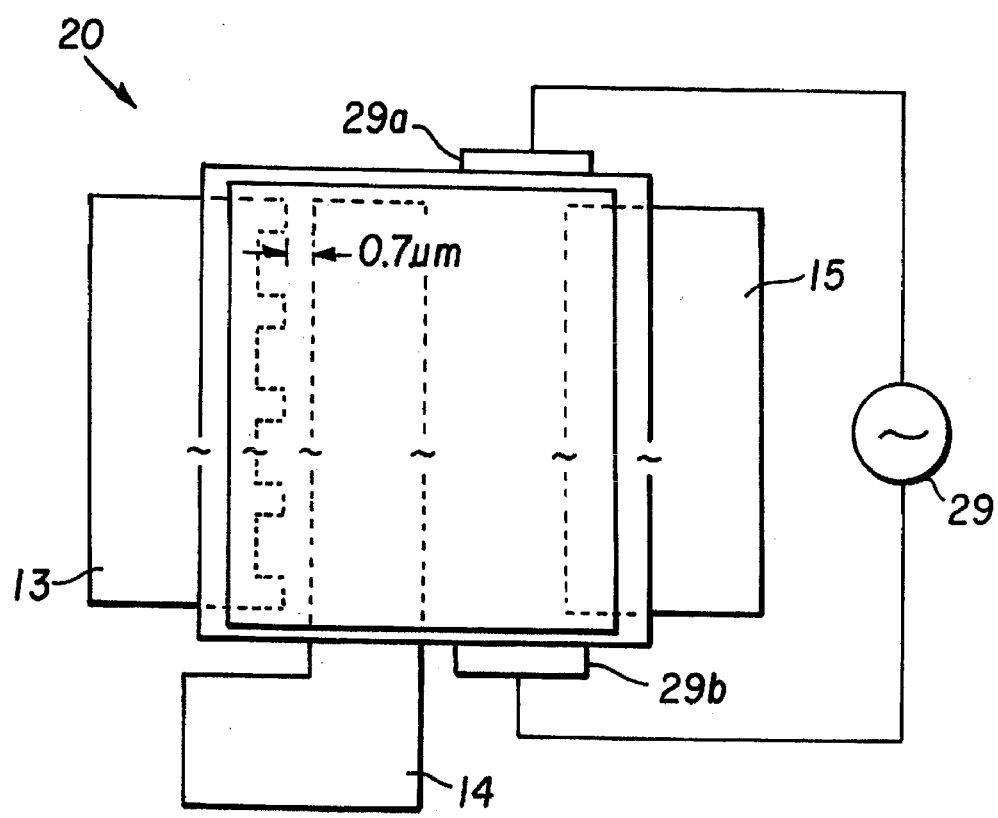

FIG. 3(a) is a perspective view schematically showing a configuration of a semiconductor chip of the second embodiment of the switching apparatus that is driven by an electromagnetic wave (microwave), and FIG. 3(b) is a sectional view of the semiconductor chip of the second embodiment of the switching apparatus. FIG. 4(a) is a perspective view schematically showing a configuration of the second embodiment of the switching apparatus that is driven by an electromagnetic wave, and FIG. 4(b) is a plan view of the second embodiment of the switching apparatus. The switching apparatus 20 comprises a silicon oxide insulation layer 12 formed on a silicon substrate 11, an inverted trapezoidal recess portion 12a formed on the insulation layer 12, a wolfram cold cathode (emitter electrode) 13 formed on the insulation layer 12 further comprising many comb-tooth like tips extending from one side above the recess portion 12a, a rectangular molybdenum gate electrode (control electrode) 14 disposed on the recess portion 12a on the side of the cold cathode 13, a wolfram anode (collector electrode) 15 formed on the insulation layer 12 and extending from another side opposed facing to the one side above the recess portion 12a, an insulative sealing member (quartz) 26 further comprising a recess portion 26a on its under surface for enclosing a dilute hydrogen gas in a vacuum space 17, a magnet 28 of magnetic flux density of 1 T, that further comprises an upper N pole disposed on the sealing member (quartz) 26 and a lower S pole disposed on the under surface of the substrate 11, for applying a magnetic field orthogonal to the electric field applied between the cathode 13 and the anode 15, and a high frequency oscillator 29, that further comprises a parallel electrodes 29a and 29b one of which is disposed on the front surface and another on the back surface of the semiconductor chip, for irradiating a microwave to the space 17.

Typical configurational parameters of the second embodiment are as follows. Size (chip size) of the silicon substrate 11 is 2 mm×2 mm. Thickness of the cathode 13 is 0.2 μm. Edge width of the comb-tooth like tip is 3 μm and pitch between the tips is 6 μm. The cathode 13 comprises about 270 pieces of tips and total width of the cathode 13 is about 1.6 mm. The gate electrode 14 is 0.2 μm in thickness, 1.6 mm in length and 3 μm in width. The anode 15 is 0.2 μm in thickness and about 1.6 mm in width. Distance between the cathode 13 and the gate electrode 14 is 0.7 μm. Distance between the cathode 13 and the anode 15 is 10 μm. The vacuum space 17 is filled with $3 \times 10^{-19}$ mole of the dilute hydrogen gas and the pressure is $6.67 \times 10^{-6}$ Pa.

Zero or negative electric potential is applied to the cathode 13. Positive electric potential is applied to the gate electrode 14. Electric potential higher than the gate electric potential is applied to the anode 15. Since the electric field of the gate electrode 14 modulates the work function of wolfram to narrow integrated potential width on the boundary surface of the cathode 13, electrons are drawn out from the cathode 13 by the Schottky effect (tunnel effect).

It is well known by experiments that the current density of the electrons field-emitted along X-axis from the cathode 13 shows little temperature dependence. The current density of the field-emitted electrons shows almost steady value under high temperatures or under radiation exposure. Since all the end surface of the comb-tooth tips of the cathode 13 are positioned equally with respect to the gate electrode 14, equal current density is obtained on every end surface of the tips. Therefore, threshold voltage of the field emission on every end surface of the tips and initial speeds of the emitted electrons at the end surfaces are equalized.

FIG. 5 is a schematic for explaining cyclotron resonance in the second embodiment. As FIG. 5 shows, the field-emitted electron moves towards the anode 15 attracted by an electric field E of the anode 15. Since a uniform magnetic field B orthogonal to the electric field E is applied in the vacuum space 17 by the magnet 28, the moving electron rotates (executes circular movement) at an angular frequency $\omega_c$ on the XY plane. The cyclotron angular frequency $\omega c$ does not depends on the velocity of the electron and is proportional to the magnetic flux density B.

The angular frequency $\omega_c$ therefore increases and rotation trajectory (traveling length) of the electron elongates with increasing magnetic flux density B. Thus the electron rotates while moving towards the anode 15. In this situation, when a displacement current (electromagnetic wave), the angular vibration frequency $\omega_f$ of which coincides with the cyclotron angular frequency $\omega_c$ and an electric field direction of which coincides with the X-axis, is irradiated to the electron path (on-period of electromagnetic wave irradiation), the electron is accelerated by the irradiated electromagnetic wave at its maximum to rotate faster and to gradually increase its radius of rotation R. Thus, the electron travels towards the anode 15 along a spiral trajectory. Since the electron is accelerated once the cyclotron resonance is enhanced, molecule M of the dilute hydrogen gas is dissociated to be ionized by collision with the accelerated electron and releases one electron. Since the released electron is then accelerated to trigger further ionization of the hydrogen gas molecules, electrons and ions are exponentially multiplied in the vacuum space 17. The multiplied electrons are captured by the anode 15 and the ions (hydrogen nucleuses) re-combine in the cathode 13.

Though only field-emitted electrons are captured by the anode to generate small anode current when the cyclotron resonance is not enhanced (off-period of electromagnetic wave irradiation), a large anode current (switching current) amplified by the multiplied carriers is obtained when the cyclotron resonance is enhanced.

Figure 6:
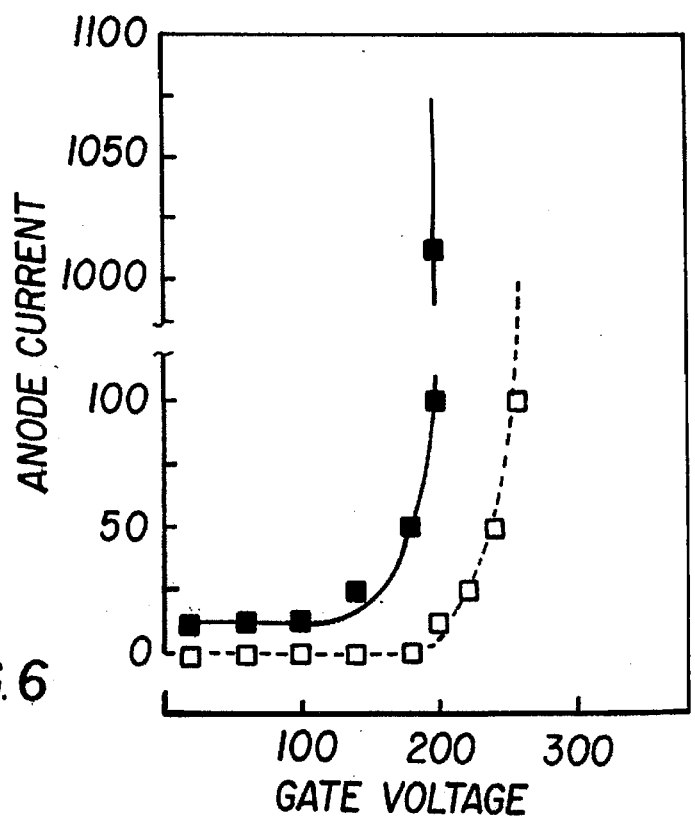
FIG. 6 is a graph showing relationships between an anode current and gate voltage in the second embodiment.
Figure 7:
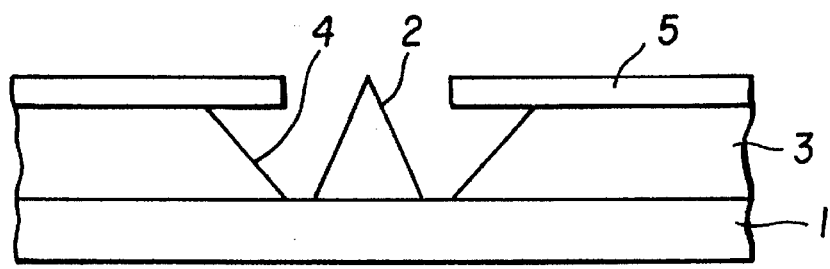
FIG. 7 is a sectional view schematically showing a configuration of an field effect electron emitter element according to the prior art.
Figure 8A:
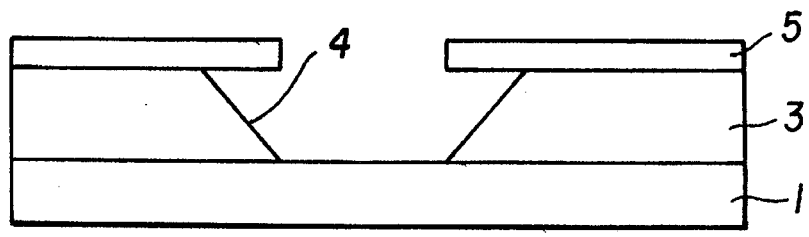
FIGS. 8(A), 8(B), 8(C), and 8(D) are sectional views for explaining manufacturing process of the field effect electron emitter element of FIG. 7.
Figure 8B:
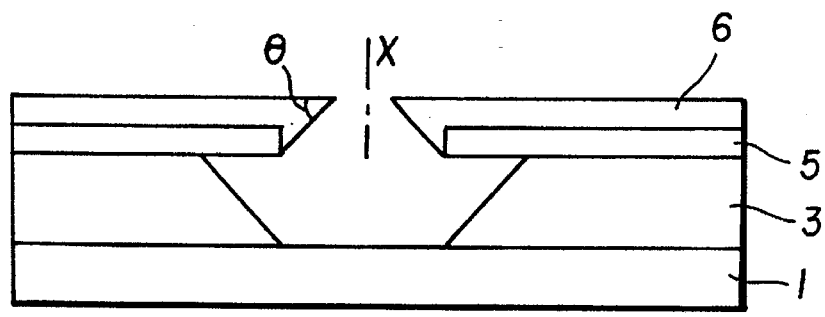
Figure 8C:
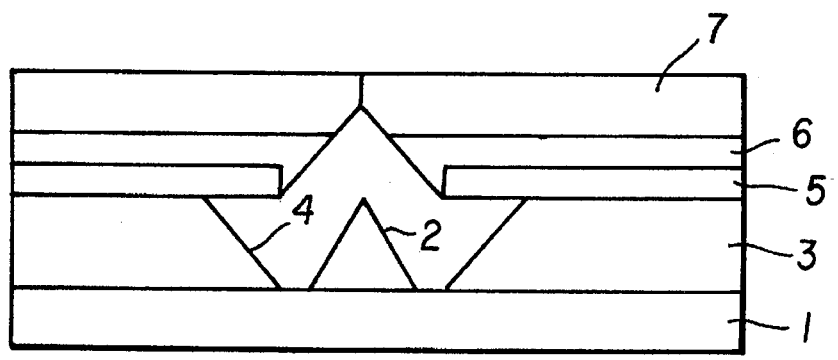
Figure 8D:
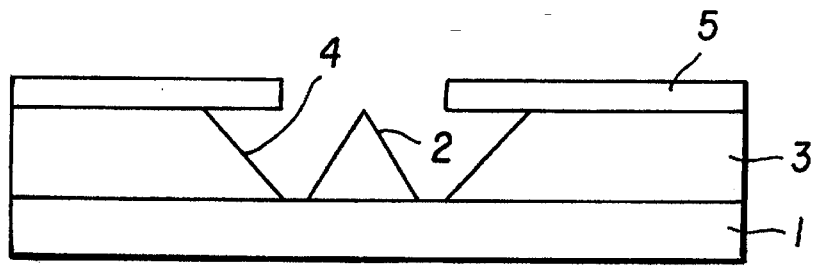

FIG. 6 shows change of an anode current with gate voltage by a broken line obtained by the prior art that utilizes only the emitted electrons and change of an anode current with gate voltage by a solid line obtained when a high frequency wave of 175.65 GHz is irradiated. As shown from this figure, the anode current is amplified at the gate voltage of 200 V by more than one order of magnitude than by the prior art when the electromagnetic wave is irradiated. Thus, multiplication of carriers by the acceleration of the electron by means of the cyclotron resonance and the ionization is effectively utilized.

Thus, the second embodiment of the switching apparatus is preferable as the first embodiment. A permanent magnet as well as an electromagnet may be employed as the magnet 28 in the second embodiment. The basic structures of the first and second embodiments may be integrated into a cell and a plurality of the cells may be further integrated on a semiconductor chip.

As described above, the present invention obtains high current density (a large switching current) by electron cascade shower enhanced by an interaction among the electrons emitted by field emission from the cold cathode, an optical or electromagnetic wave and the dilute gas atoms (molecules). Therefore following effects are obtained by the present invention.

(1) Since a sufficiently large current is easily obtained, a structure and shape of the cold cathode are freely designed with little limitation. This design freedom further facilitates manufacturing the switching apparatus with excellent reproducibility and high yield.

(2) Since a sufficiently large current is obtained, the anode potential can be maintained at a lower level than the prior art switching apparatus.

(3) High speed current switching is realized by switching on and off optical or electromagnetic wave irradiation.

(4) Since the comb-tooth like tips of the cathode are easily formed by the conventional photolithographic technique, unfavorable statistical distributions in the manufacturing and performance of the switching apparatus are minimized.

What is claimed is:

1. A switching apparatus driven by an optical wave comprising:

an insulation layer, formed on a semiconductor substrate, comprising a recess portion;

a cathode formed on one side of said recess portion on said insulation layer;

an anode formed on another side opposed facing to said one side of said recess portion on said insulation layer;

a control electrode formed on the side of said cathode on said recess portion;

an optically transparent sealing means for enclosing dilute gas in vacuum space enveloping therein said cathode, said anode, and said control electrode; and an optical irradiation means for intermittently irradiating an optical wave to said vacuum space.

2. The switching apparatus as claimed in claim 1, wherein said cathode further comprises a plurality of comb-tooth like tips.

3. A switching apparatus driven by an electromagnetic wave comprising:

an insulation layer, formed on a semiconductor substrate, comprising a recess portion;

a cathode formed on one side of said recess portion on said insulation layer;

an anode formed on another side opposed facing to said one side of said recess portion on said insulation layer;

a control electrode formed on the side of said cathode on said recess portion;

an insulative sealing means for enclosing dilute gas in vacuum space enveloping therein said cathode, said anode, and said control electrode;

a magnetic field application means for applying in said vacuum space a magnetic field orthogonal to an electric field applied between said cathode, and said anode; and an electromagnetic irradiation means for intermittently irradiating an electromagnetic wave to said vacuum space.

4. The switching apparatus as claimed in claim 3, wherein said cathode further comprises a plurality of comb-tooth like tips.

* * * * *